US006434051B1

(12) United States Patent
Endo

(10) Patent No.: US 6,434,051 B1
(45) Date of Patent: Aug. 13, 2002

(54) NON-VOLATILE MEMORY CIRCUIT

(75) Inventor: Toru Endo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/926,648

(22) PCT Filed: Feb. 28, 2000

(86) PCT No.: PCT/JP00/01157
§ 371 (c)(1),
(2), (4) Date: Nov. 28, 2001

(87) PCT Pub. No.: WO01/01420
PCT Pub. Date: Jan. 4, 2001

(30) Foreign Application Priority Data

Jun. 24, 1999 (JP) ............................. 11-178614

(51) Int. Cl.[7] .............................................. G11C 16/06
(52) U.S. Cl. ............................ 365/185.21; 365/185.05; 365/185.28
(58) Field of Search ....................... 365/185.03, 185.05, 365/185.21, 185.28

(56) References Cited

U.S. PATENT DOCUMENTS 5,428,571 A * 6/1995 Atsumi et al. ............ 365/185.1
5,521,858 A * 5/1996 Shibata et al. .......... 365/185.03
6,111,791 A * 8/2000 Ghilardelli .............. 365/185.28

FOREIGN PATENT DOCUMENTS

| JP | 5-282881 | 10/1993 |
| JP | 9-265786 | 10/1997 |
| JP | 10228790 | 8/1998 |

* cited by examiner

Primary Examiner—Son Mai
(74) Attorney, Agent, or Firm—Arent Fox Kintner Plotkin & Kahn, PLLC

(57) ABSTRACT

The present invention provides a non-volatile memory circuit that can easily read and write. Especially, the present invention is effective to storage multi-value or analog value. The present invention has a storage transistor Nc with a floating gate and a feedback transistor Nf with a floating gate whose source are connected commonly and a load circuit is provided to the drain side of both transistors. A negative feedback circuit is provided between the drain of the storage transistor Nc and the floating gate of the feedback transistor Nf. An output transistor P2 is a preferable example of the negative feedback circuit, whose gate is connected to the drain of the storage transistor and which generates a voltage corresponding to that gate voltage at an output terminal. This output terminal and the floating gate of the feedback transistor are connected. A memory circuit of such a configuration operates so that the voltage corresponding to the charge in the floating gate of the storage transistor Nc and the output voltage of the output terminal OUT become the same. Therefore, the voltage of the floating gate of the storage transistor can be directly detected.

8 Claims, 11 Drawing Sheets

NON-VOLATILE MEMORY CIRCUIT

TECHNICAL FIELD

The present invention relates to a non-volatile memory circuit with a floating gate, and more particularly to a non-volatile memory circuit that can directly read the floating gate voltage of a storage transistor with a floating gate.

BACKGROUND ART

Non-volatile memory that uses transistors with floating cells in memory cells can store data even after the power is turned off and can be used in various aspects.

Conventional non-volatile memory circuits write (program) data by injecting a charge into the floating gate of a memory cell transistor to increase its threshold voltage, and delete data by extracting the charge from the floating gate to lower the threshold voltage. Data is '0' when the threshold voltage is high and '1' when the threshold voltage is low, and binary data is stored in the memory cell.

When such binary data is to be read, a prescribed read voltage is applied to a control gate of a memory cell transistor and the value of the current flowing through that transistor in accordance with the threshold voltage at that time is detected. Here, a reference voltage, which is between the two threshold voltages described above, is applied to the gate of a reference transistor and the current from the above memory cell transistor and the reference current from the reference transistor are compared.

Write (program) and erase operations can also be implemented by using the reference current from such a reference transistor. That is, when data is being written, a charge is injected into the floating gate until the value of the current from the memory cell transistor becomes smaller than the reference current. When data is being erased, charge is extracted from the floating gate until the value of the current from the memory cell transistor becomes greater than the reference current.

However, with the increasing capacity of information being stored in memory cells, the information being stored is tending to be multi-value or analog data. That is, when n-value data is to be stored in a memory cell, an n-stage charge injection level is set in the floating gate and the accompanying differences in n-stage threshold voltages must be read.

In the method wherein the current from a conventional memory cell transistor is compared with the current from a reference transistor, it is difficult to read information stored as multi-value or analog information. This is because to read n-value stored information using conventional methods, n−1 type reference voltages must be applied to the reference transistor and the n−1 type reference currents must be compared only with the current from the storage transistor.

Thus, in the method wherein a charge is injected into and extracted from the floating gate of a memory cell transistor and the accumulated charge is read as the value of the current of the storage transistor that corresponds to the threshold voltage of the memory cell transistor, it is extremely difficult to cope with any future change to multi-value or analog data.

Therefore, an object of the present invention is to provide a non-volatile memory circuit that can easily read information from a storage transistor with a floating gate.

A further object of the present invention is to provide a non-volatile memory circuit that can easily write information to a storage transistor with a floating gate.

A still further object of the present invention is to provide a non-volatile memory circuit that can easily read information from a storage transistor with a floating gate that stores multi-value or analog data.

An even still further object of the present invention is to provide a non-volatile memory circuit that can easily write information to a storage transistor with a floating gate that stores multi-value or analog data.

Another further object of the present invention is to provide a non-volatile memory circuit that broadens the dynamic range that can be stored by a storage transistor with a floating gate.

DISCLOSURE OF THE INVENTION

In one view of the present invention, both a storage transistor with a floating gate and a feedback transistor with a floating gate are commonly connected at the source thereof and a load circuit is provided on the drain side of both transistors. A negative feedback circuit is provided between the drain of the storage transistor and the floating gate of the feedback transistor. An output transistor for amplification is a preferable example for the negative feedback circuit. Its gate is connected to the drain of the storage transistor and a voltage corresponding the gate voltage is generated at an output terminal. This output terminal and the floating gate of the feedback transistor are connected.

The memory circuit of such configuration operates so that the voltage corresponding the charge in the floating gate of the storage transistor and the output voltage of the output terminal become the same. Therefore, the voltage of the floating gate of the storage transistor can be directly detected at the output terminal. Accordingly, multi-value or analog information can be easily written to or read from the floating gate of the storage transistor. Similarly, information can be easily written or read when binary information has been stored.

To achieve the above objects, the non-volatile memory circuit in another view of the present invention comprises: a storage transistor with a storage floating gate; a feedback transistor with a feedback floating gate, commonly connected at a source with the above storage transistor; a load circuit connected to the storage transistor and the feedback transistor; an output transistor, having a gate connected to the drain of the storage transistor, for generating a voltage corresponding to the gate voltage at an output terminal and; a feedback path provided between the output terminal and the feedback floating gate.

BEST MODE FOR CARRYING OUT THE INVENTION

An embodiment of the present invention will be explained with reference to diagrams. However, such the embodiment do not limit the technical scope of the present invention.

Figure 1:
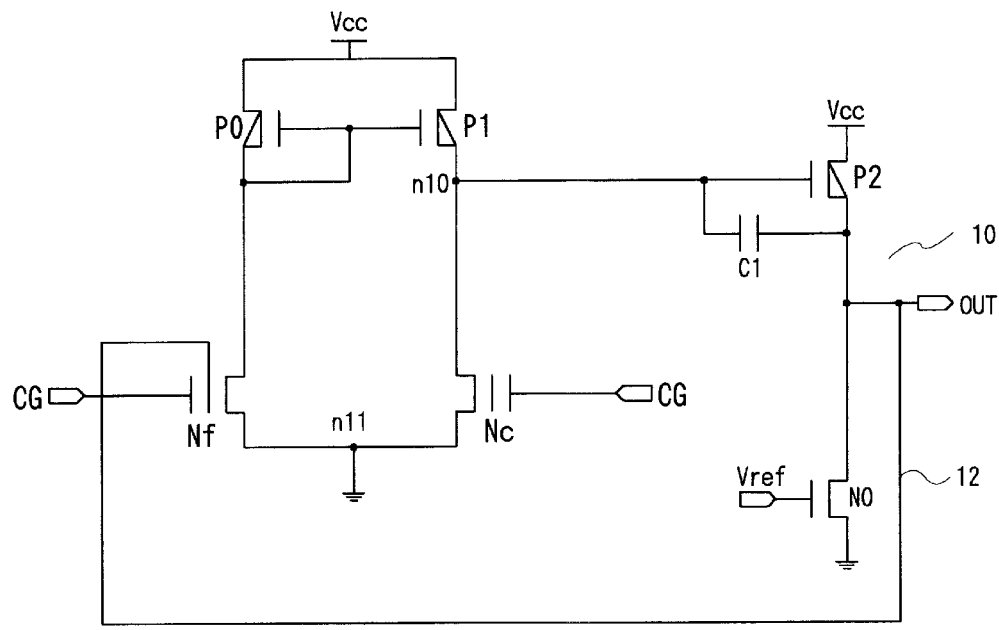
FIG. 1 shows a non-volatile memory circuit of the embodiment of the present invention.

FIG. 1 shows a non-volatile memory circuit in an embodiment of the present invention. In the non-volatile memory circuit shown in FIG. 1, a storage transistor Nc that stores information and a feedback transistor Nf are commonly connected at a source. A load circuit that forms a current mirror circuit comprising P-channel transistors P0 and P1 is provided between the drain for transistors Nc and Nf and the power source Vcc. Both transistors P0 and P1 in this load circuit operate in a saturation area. The same voltage is applied to both gates and they operate as a constant current source supplying the same current.

The storage transistor Nc is an N-channel transistor with a floating gate and a control gate. The feedback transistor Nf is also an N-channel transistor with a floating gate and a control gate. The source terminal, which is connected to both transistors, is connected to an earth potential. Accordingly, a comparator circuit is constructed with transistors Nc and Nf and load circuits P0 and P1. When the same prescribed voltage is applied to the control gates of both transistors in this comparator circuit, the currents that correspond to the voltages of the floating gates flow to transistors Nc and Nf respectively and a voltage that corresponds to the floating gate voltage is output to the node n10 of the drain terminal of the storage transistor Nc.

That is, by combining the voltage of the floating gates and the voltage of the control gates, a gate-source voltage is provided in both transistors Nc and Nf. Accordingly, if many charges accumulate in the floating gate and their electric potential becomes low, even if the same control gate voltage is applied, the gate-source voltage of the transistor will be low. Therefore, the transistor operates as if the threshold voltage becomes higher, impedance becomes higher and the drain current becomes smaller. When the amount of charge in the floating gate decreases, the transistor conversely operates as if the threshold voltage becomes lower, impedance becomes lower, and the drain current becomes larger.

Node n10, which is the drain terminal for storage transistor Nc, is connected to the gate of the P-channel output transistor P2. The source of output transistor P2 is connected to power source Vcc and its drain is connected to the output terminal OUT. As a result, an operational amplifier is constracted by the above comparator circuit and this output transistor P2.

Both the output terminal OUT and the floating gate of the feedback transistor Nf are connected by the feedback line 12. Such a configuration enables a negative feedback circuit 10 to be provided between node n10, which is the drain terminal of the storage transistor Nc, and the floating gate of the feedback transistor Nf. The output transistor P2 is provided with an N-channel transistor N0 which is the power source, between the output transistor P2 and the ground potential. A prescribed reference voltage Vref is applied to the gate of this N-channel transistor N0.

As a result of the provision of the above negative feedback circuit 10, the voltage of the output terminal OUT is controlled so that it becomes almost equal to the floating gate voltage of the storage transistor Nc. The memory circuit pictured in FIG. 1 operates so that by providing a P-channel output transistor in an ordinary comparator circuit, which comprises a pair of transistors having commonly connected sources, and connecting the drain of the output transistor (output terminal) to the inverse input of the comparator circuit, the output terminal has almost the same voltage as the voltage at the non-inverse input of the comparator circuit.

That is, a prescribed charge is injected into the floating gate of the storage transistor Nc and the storage transistor Nc is controlled to the prescribed threshold voltage. An equal voltage is applied to the control gates CG of the storage transistor Nc and feedback transistor Nf.

As a result, the potential of the floating gate is output, as is, to the output terminal out.

For example, when data is not being written (in a non-programming state) and the charge in the floating gate of the storage transistor Nc is little, the threshold voltage of the storage transistor Nc is lower. The drain current flowing through the storage transistor Nc is higher and the node n10 is lowered towards the earth potential side. Here, the impedance of the storage transistor Nc becomes low. Reduction of the node n10 causes the output transistor P2 to become more conductive and the potential of the output terminal OUT to rise. This causes the potential of the floating gate in the feedback transistor Nf to rise also. Finally, when the output terminal OUT is almost the same as the voltage caused by the charge in the floating gate of the storage transistor Nc, the left and right sides of the comparator will be balanced.

On the other hand, when data is being written (during programming), a charge is injected into the floating gates and the threshold voltage rises. The drain current flowing through the storage transistor Nc drops. With the drop in this drain current, the node n10 potential will rise, the voltage between the gate and source of the P-channel transistor P2 will become smaller, there will be less current flowing between the source and drain of the transistor P2, and the potential of the output terminal OUT will drop.

As a result, the potential of the floating gate of the feedback transistor Nf, connected to the output terminal OUT via a feedback line 12, will also drop. The drop in this potential will continue until the potential of the floating gate in the feedback transistor Nf becomes the same as the potential of the charge injected floating gate of the memory cell transistor Nc. When the potentials of both floating gates are approximately equal, the currents for both transistors Nc and Nf in the comparator circuit will be equal and the circuit will be balanced and in a stable state.

As above, the non-volatile memory circuit shown in FIG. 1 operates so that a potential that is approximately the same as the potential of the floating gate in the storage transistor Nc is always produced at the output terminal OUT. Accordingly, detection of output terminal OUT enables to find out the potential corresponding to the amount of charge accumulated in the floating gate of the storage transistor Nc. In other words, when writing or programming, the amount of charge injected into the floating gate can be found out by detecting the voltage of the output terminal OUT. The charge can likewise be found when data is being read. Note however, that when data is being erased, a negative voltage must be applied to the control gate CG, the power source voltage applied to the source of the storage transistor Nc, and the charge within the floating gate extracted. Accordingly, verification of an erase operation is implemented in a separate condition from the erase operation.

Accordingly, the memory circuit in the embodiment does not indirectly detect differences in threshold voltages that match the amount of charge accumulated in the floating gate through the transistor current value, as in conventional examples, but can directly detect the charge accumulated in the floating gate of the storage transistor. As a result, multi-value information and analog information can be detected as is and data can be written or read easily.

In the embodiment, the write operation is the program peration and refer to the injection of a charge (electrons) into the floating gate. The operation that withdraws the charge (electrons) from the floating gate is called an erase peration.

Figure 2:
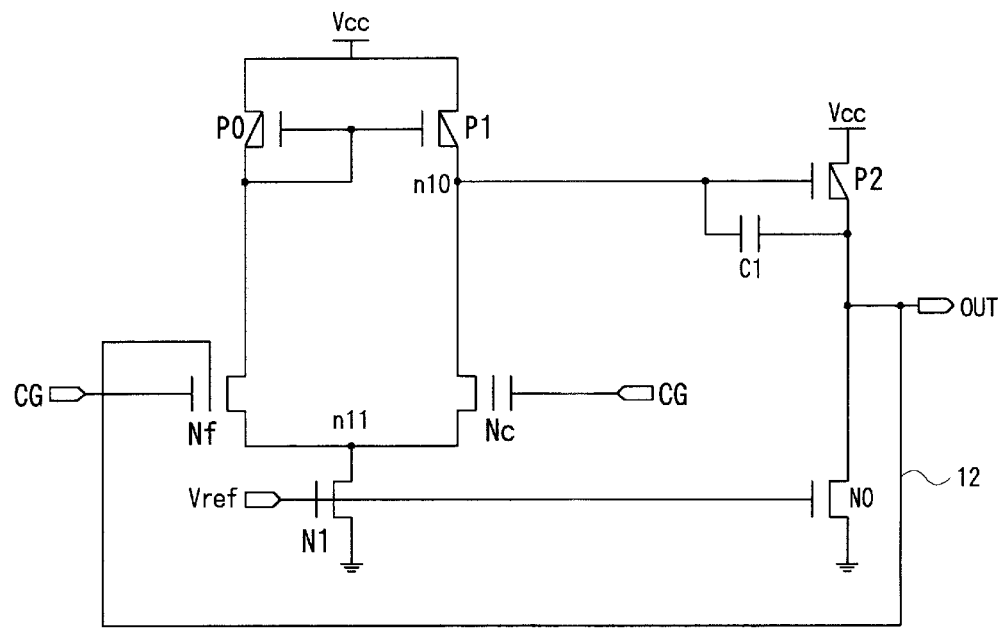
FIG. 2 shows an example of a modification of the non-volatile memory circuit in the embodiment.

FIG. 2 shows a modification of the non-volatile memory circuit in the embodiment. Parts that also appear in FIG. 1 are given the same reference numbers in this figure. In the memory circuit of FIG. 2, a current source transistor N1, in which a gate is connected to a prescribed reference voltage Vref, is placed between the earth potential and source n11, which is common to both the memory cell transistor Nc and feedback transistor Nf. Except for this transistor N1, the configuration is the same as that for the memory circuit in FIG. 1.

In the memory circuit of FIG. 1, the source n11 that is common to both transistors Nc and Nf is directly connected to an earth potential. Accordingly, for both transistors Nc and Nf to maintain a conductive state and for the comparator circuit to operate effectively, the voltage between the gate and source caused by the floating gate and control gate must exceed the threshold voltage and current must flow through both transistors. Accordingly, when the prescribed voltage is applied to the control gate, the acceptable voltage range of the floating gate cannot be lower than a certain voltage. In other words, the control gate voltage must be in a range that is higher than the threshold voltage determined by the amount of charge in the floating gate. Therefore, there is a limit on the amount of charge that can be injected into the floating gate for the same control gate voltage, and the dynamic range narrows.

In contrast, in the memory circuit of FIG. 2, a transistor N1, in which a constant current is always supplied to the source N11 that is common to both transistors Nc and Nf, is provided between the common source n11 and the earth potential. Accordingly, the common source n11 is brought down by the constant current of transistor N1, the operating range of both transistors Nc and Nf can be broadened, and the dynamic range is increased.

In the example of a memory circuit shown in FIG. 2, the same gate voltage Vref is supplied to the gate of transistor N0, which is the constant current source for output transistor P2, and to transistor N1, which is the constant current source for the comparator circuit.

In the memory circuit of FIG. 2 also, a voltage that is approximately the same as the floating gate voltage in the storage transistor Nc is generated at the output terminal OUT and the amount of charge injected into the storage transistor Nc can be easily detected. Accordingly, information in storage transistors with floating gates for storing multi-value or analogue data can be read easily.

Figure 3:
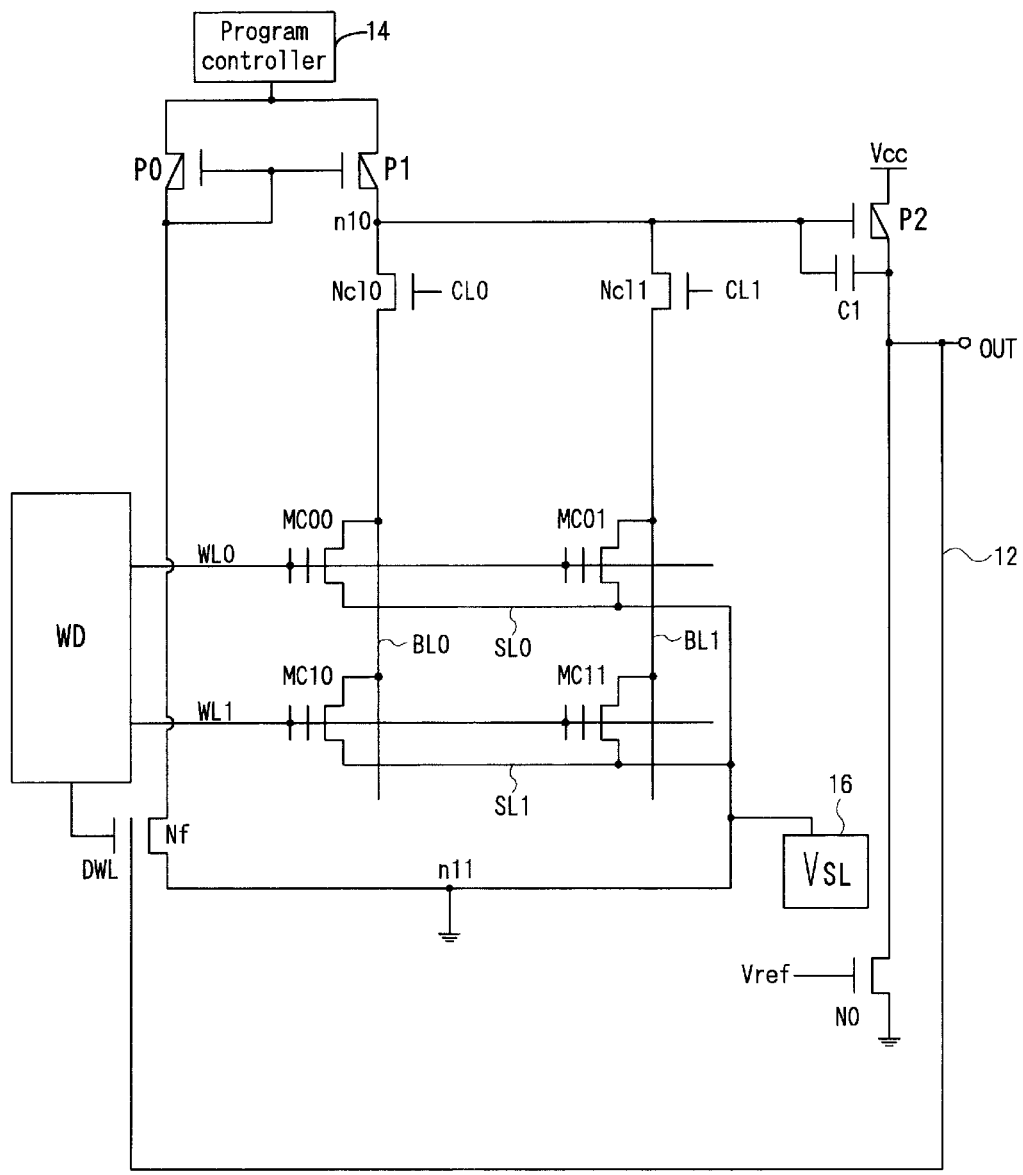
FIG. 3 shows an example of a circuit that includes storage transistors provided in a 2×2 matrix, using the memory circuit of FIG. 2.

FIG. 3 is an example of a circuit that uses the memory circuit of FIG. 1 but arranges storage transistors in 2×2 matrix. The transistors P0 and P1 that make up the current mirror circuit, the output transistor P2, output terminal OUT, feedback transistor Nf, and current source transistor N0 are the same as in FIG. 1.

In the circuit example of FIG. 3, four memory cells MC00 through MC11 are made by the storage transistor Nc. Their transistor source terminals are connected to the source of the feedback transistor Nf source via source lines SL0 and SL1. The drains of the storage transistors that make up the memory cells are connected to bit lines BL0 and BL1 respectively. The control gates are connected to word lines WL0 and WL1 respectively. Bit lines BL0 and BL1 are connected to transistor P1, which makes up the current mirror circuit, via column gates Nc10 and Nc11 that are made conductive by column selection signals CL0 and CL1. A dummy word line DWL is connected to the control gate of the feedback transistor Nf. A voltage that is the same as that for selected word lines WL0 and WL1 is applied to this dummy word line DWL. The dummy word line and word lines are driven to the prescribed voltage by a word driver WD.

In the memory circuit of FIG. 3, a word line is selected by the word driver WD and bit lines are selected by column selection signals CL0 and CL1. When data is written (during programming), the selected bit line is given a write voltage Vpp that is higher than the power source voltage Vcc by the program control circuit 14, for example, and the word line selected by the word driver WD is driven to the power source voltage Vcc. Also, at this time the source line SL is connected to the earth potential. As a result, a charge (electrons) is injected into the floating gate of the transistors in the selected memory cell MC.

When the output of the program control circuit 14 becomes the read voltage Vcc, the circuit in FIG. 3 has the same configuration as the memory circuit in FIG. 1. That is, a voltage that is approximately the same as the floating gate voltage in the storage transistors that make up the memory cells is generated at the output terminal OUT. Accordingly, by placing an operational amplifier at the output terminal OUT, the value of the floating gate voltage that matches the charge accumulated in the floating gate of the memory cell transistor can be directly detected. In these read operations or verify operations that follow write operations, the word driver WD drives the selected word line WL and dummy word line DWL to the same read voltage.

In the non-volatile memory circuit of FIG. 3, data is erased when a circuit, not shown, controls the voltage of the word line WL to be negative (for example −9V) and the voltage of the source line SL to be the power source voltage Vcc. As a result, the charge (electrons) is extracted from the floating gate. The verify operation that occurs after erasure is implemented in the same way as the above read operation.

Figure 4:
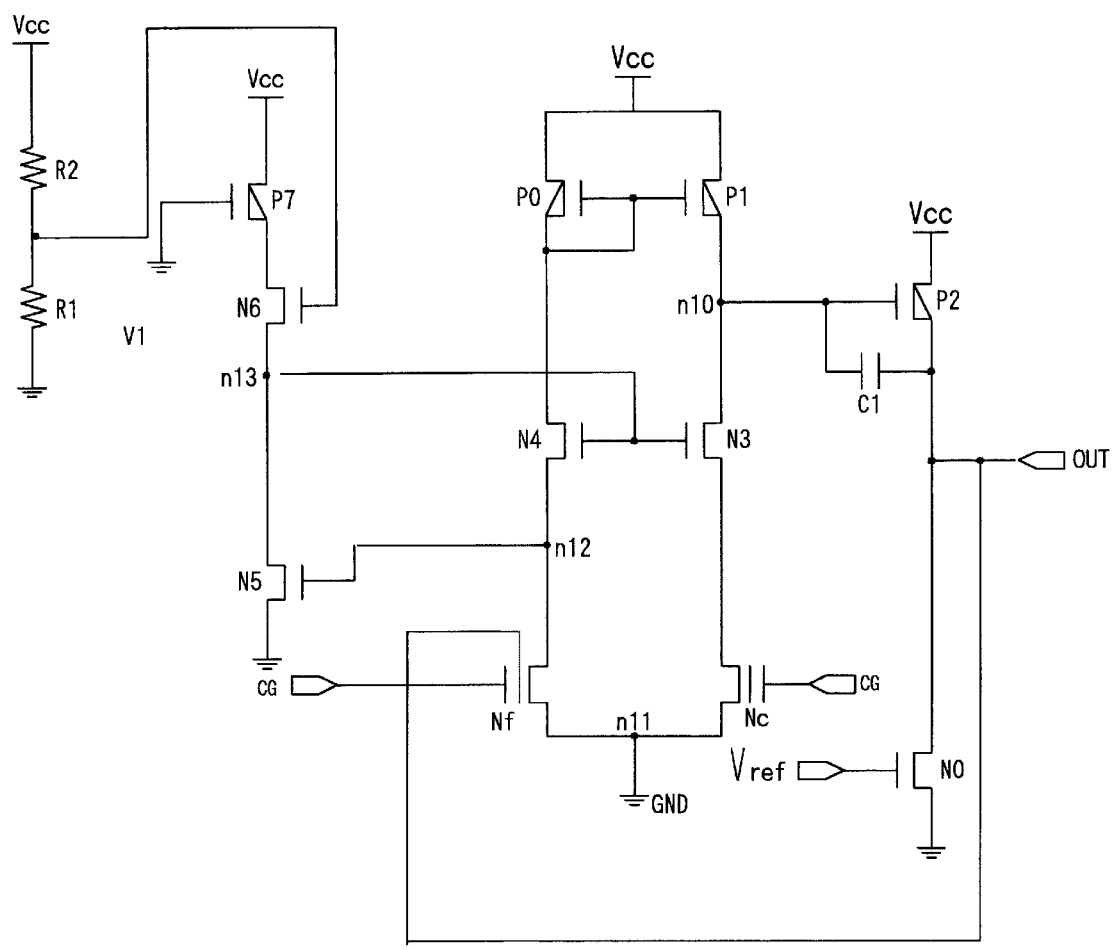
FIG. 4 shows an example of a further modification of the non-volatile memory circuit in the embodiment.

FIG. 4 shows a further modification of the non-volatile memory circuit in the embodiment. In the non-volatile memory circuits shown in FIGS. 1 and 2, when the amount of charge in the floating gate is increased and the threshold voltage of the storage transistor Nc increased, the impedance of the circuit also increases. As a result, the drain voltage of the storage transistor becomes too high, the storage transistor Nc essentially enters a programmable condition, and an unnecessary charge is injected (written). In the circuit of FIG. 4, a clamp circuit that suppresses the drain voltage is provided to prevent this unnecessary programmable condition.

This clamp circuit, which suppresses the drain voltage, comprises N-channel transistors N3 and N4. A voltage (n13) which drops as the drain voltage in storage transistor Nc or feedback transistor Nf rises, is applied to the gates of these transistors. This means that when the drain voltage starts to rise, node n13 drops, and the conductivity of transistors N3 and N4 drops, thus suppressing any rise in the drain voltage of both transistors Nc and Nf.

In the example in FIG. 4, the drain terminal n12 of the feedback transistor Nf is connected to the gate of the N-channel transistor N5 in a feedback circuit. The feedback circuit comprises: a P-channel transistor P7 wherein the gate is connected to the ground and the source is connected to the power source Vcc; N-channel transistor N5; and N-channel transistor N6 wherein a constant voltage V1, divided between resistors R1 and R2, is applied to the gate In this feedback circuit, transistor P7 is a load circuit that supplies a constant current. The current flowing in transistor N5 increases when the drain terminal n12 of the feedback transistor Nf rises. Then, the voltage of node n13 drops, the gate voltage of clamp circuits N3 and N4 drops, thus preventing any unnecessary rise in the drain voltages of storage transistors Nc and Nf. Note here that transistor N6 prevents any unnecessary drop in node n13. Accordingly, the drain voltages of both transistors Nc and Nf are restricted within a prescribed range.

Even if clamp circuits N3 and N4 are provided, the operation wherein the potential of node n10 changes in response to changes in the threshold voltage of storage transistor Nc is the same as in FIGS. 1 and 2.

Figure 5:
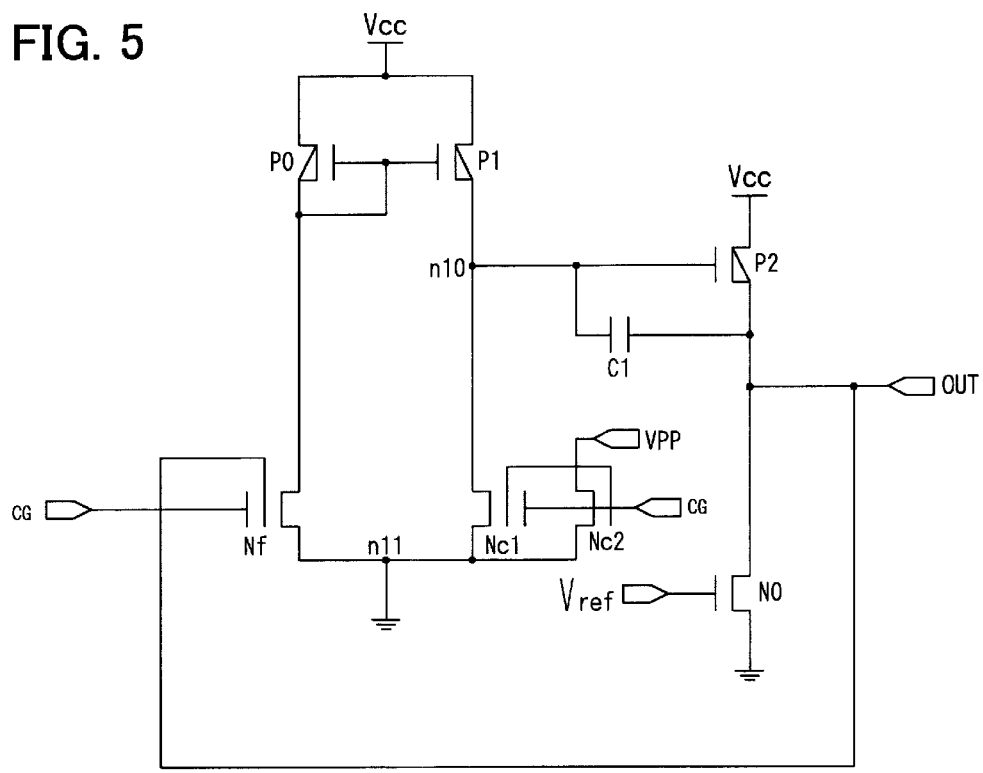
FIG. 5 shows an example of a still further modification of the non-volatile memory circuit in the embodiment.

FIG. 5 is a still further modification of the non-volatile memory circuit in the embodiment. In this example, content addressable memory (CAM) is used for the storage transistor Nc. As shown in FIG. 5, storage transistor Nc comprises transistor Nc1 for reading and transistor Nc2 for writing. Transistor Nc1 for reading has the same configuration as storage transistor Nc in FIGS. 1, 2, and 4. Transistor Nc2 for writing is connected to the same floating gate, control gate, and source as transistor Nc1 for reading.

In this type of CAM memory cell transistor, it is possible to monitor changes in the amount of charge (or changes in the threshold) in the floating gate of the reading transistor Nc1 while a high voltage Vpp for programming is being applied to the drain of the write transistor Nc2. Accordingly, a charge is injected into the storage transistor Nc, as in the non-volatile memory circuit of FIGS. 1, 2, and 4, and then the change in the amount of charge (or change in threshold voltage) in the floating gate of storage transistor Nc is detected from the output terminal OUT. This means that time division of write operations (programming) and verify operations is not required.

In particular, the non-volatile memory circuit in the embodiment is able to directly monitor the voltage of the floating gate in storage transistor Nc from output terminal OUT. Accordingly, as in FIG. 5, by using CAM memory cell transistors Nc1 and Nc2 a charge can be injected into the floating gate of the storage transistor while any change in that charge can be monitored in the output terminal OUT. As a result, there is no need to have separate periods for charge injection operations and verify operations. So-called verify free operation is enabled.

Figure 6:
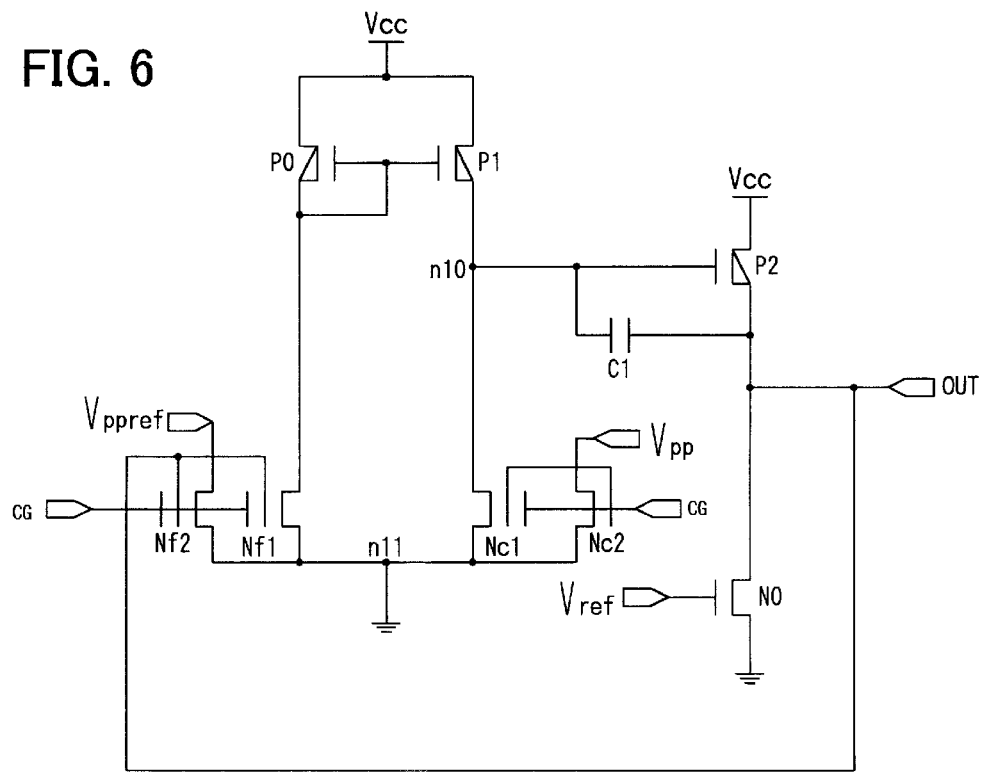
FIG. 6 shows an improvement made on FIG. 5.

FIG. 6 is an example of an improvement made to FIG. 5. In this example, memory cell transistor Nc is made up of read transistor Nc1 and write transistor Nc2. At the same time, the feedback transistor Nf, which pairs up with these, is also contructed in a similar paired transistor configuration. That is, the feedback transistor Nf comprises a transistor Nf1 paired with the read transistor Nc1 and a dummy transistor Nf2 paired with the write transistor Nc2. The remaining configuration is the same as in the circuit example given in FIG. 5.

A voltage Vpp for the program is applied in the drain of the write transistor Nc2 on the memory cell transistor side. A dummy voltage Vppref is also applied to the drain of feedback transistor Nf2 to match this.

Thus, by using a pair of transistors Nc1 and Nc2 and Nf1 and Nf2 for the storage transistor Nc and feedback transistor Nf respectively, the comparator circuit is basically balanced and the voltage of the floating gate in the storage transistor Nc can be accurately read at the output terminal OUT.

Figure 7:
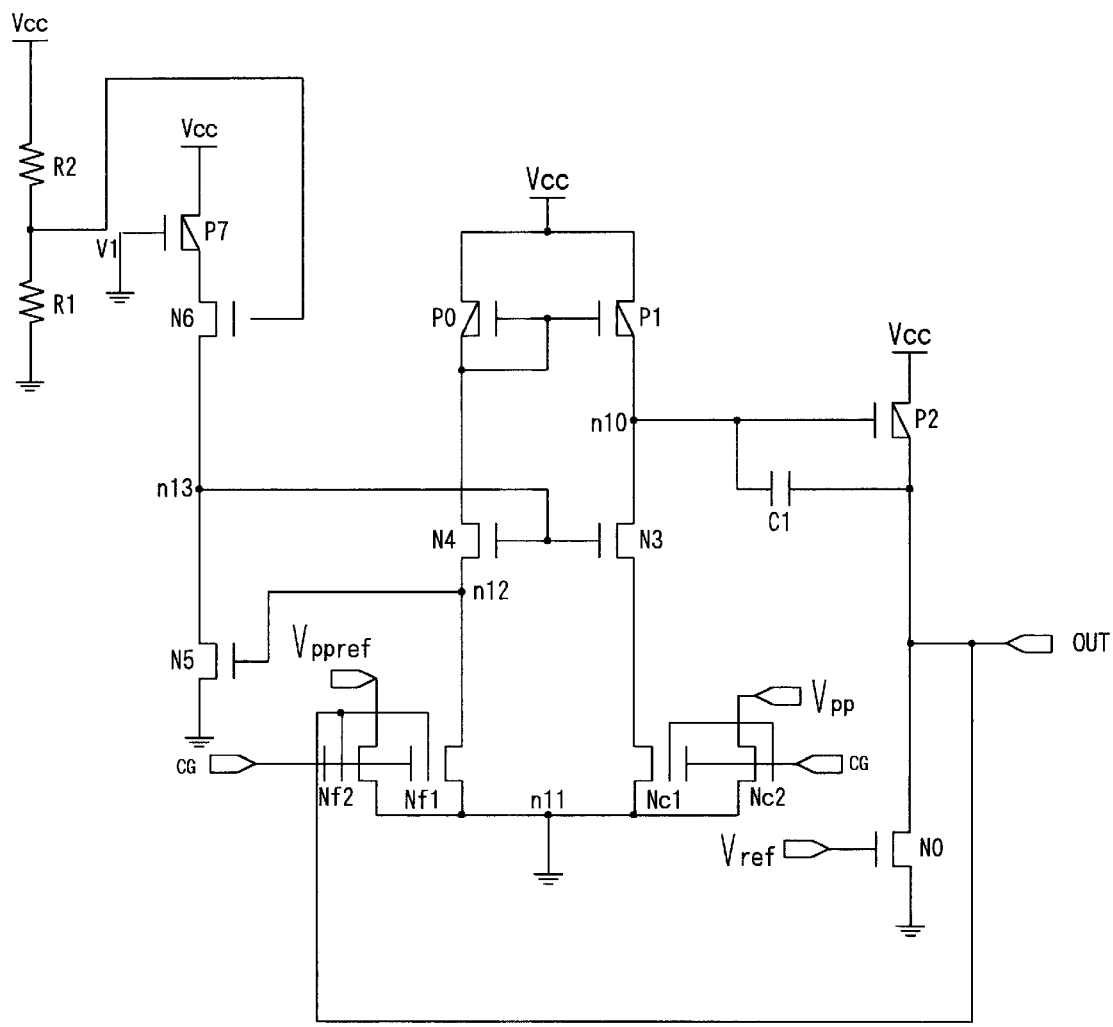
FIG. 7 shows a non-volatile memory circuit that combines FIG. 4 and FIG. 6.

FIG. 7 shows a non-volatile memory circuit that combines FIGS. 4 and 6. That is, storage transistors and feedback transistors in FIG. 6 are each paired and injection of a charge into the floating gate is enabled while data is being read. Furthermore, a clamp circuit comprising transistors N3 and N4 is provided to disable unnecessary writing when, during a read operation, the drain voltage in storage transistor Nc1 rises. The configuration of the clamp circuit and the configuration of its feedback circuit are the same as shown in the example of FIG. 4.

Figure 8:
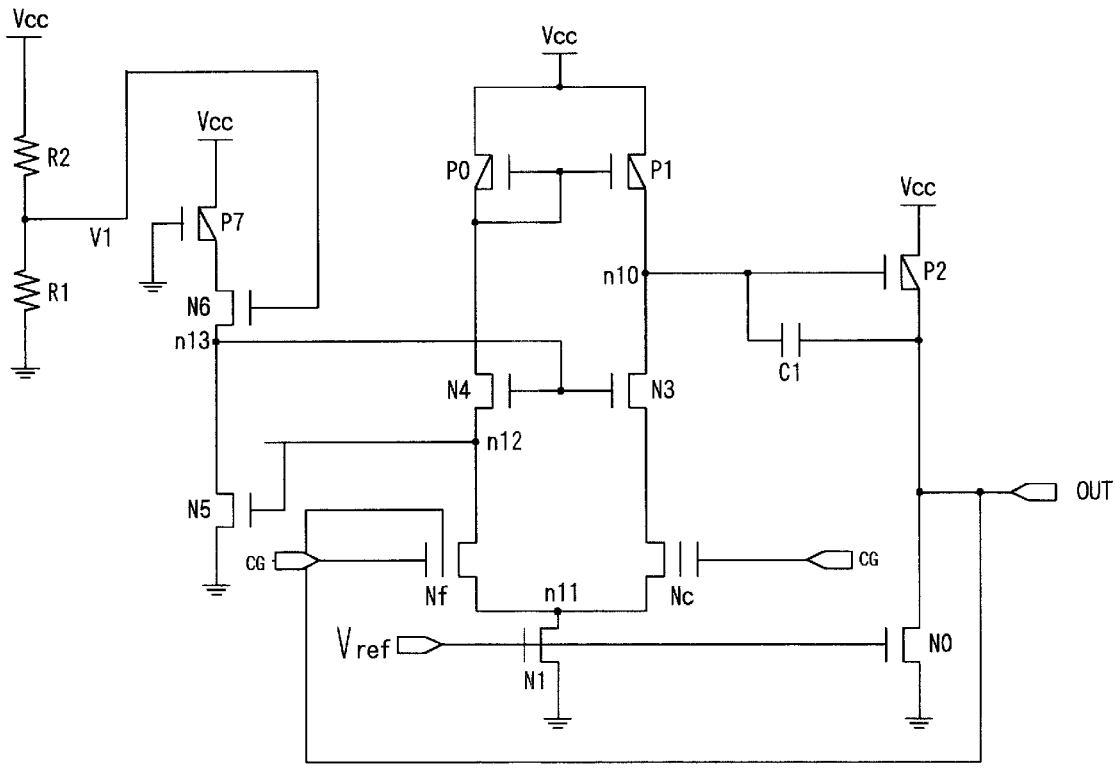
FIG. 8 shows an example in which the current source transistor of FIG. 2 is placed in FIG. 4.

FIG. 8 shows an example in which the current source transistor of FIG. 2 is provided in the circuit of FIG. 4. Between the common source terminal n11 and the earth in a memory circuit in which the clamp circuit of FIG. 4 has been provided, a current source transistor N1 is provided, in which a constant voltage Vref is applied to the gate and which supplies a constant current to the common source terminal.

Provision of this current source transistor N1, as explained in FIG. 2, enables the range (dynamic range) of voltages that can be stored in the storage transistor to be broadened. All other aspects of the configuration are the same as for the example in FIG. 4.

Figure 9:
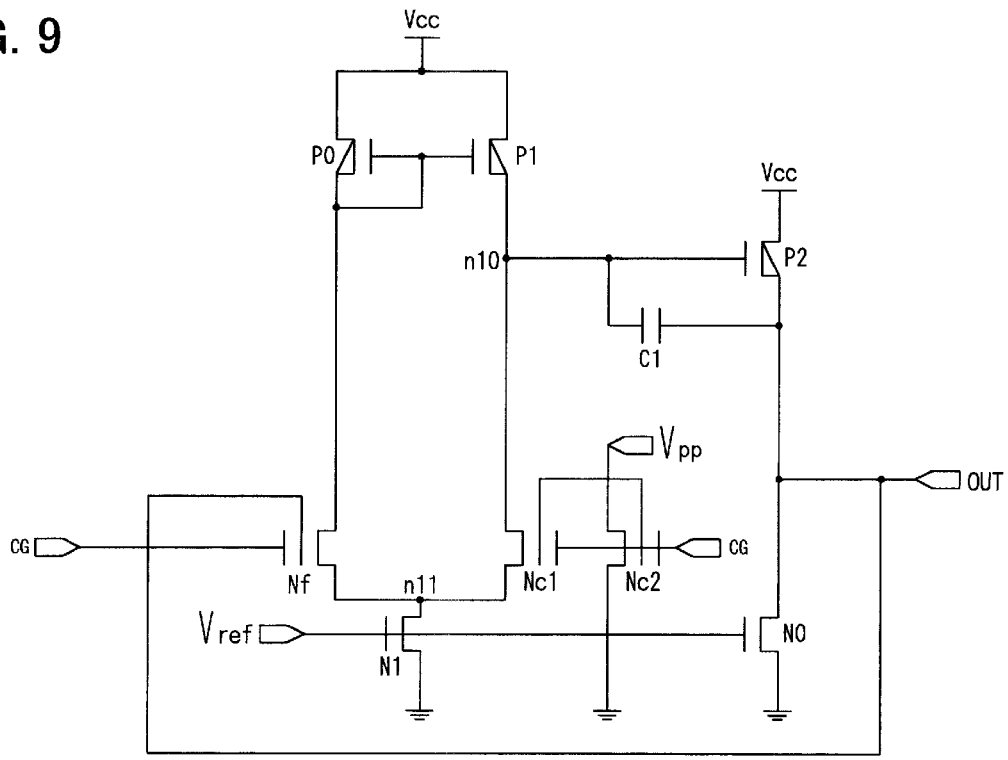
FIG. 9 shows an example in which the current source transistor of FIG. 2 is placed in FIG. 5.

FIG. 9 shows an example in which the current source transistor of FIG. 2 is placed in FIG. 5. A current source transistor N1 is placed between the common source terminal n11 and the earth of the non-volatile memory circuit of FIG. 5. In addition, the source terminal of the write transistor Nc2 is directly connected to the earth for programming operations.

Figure 10:
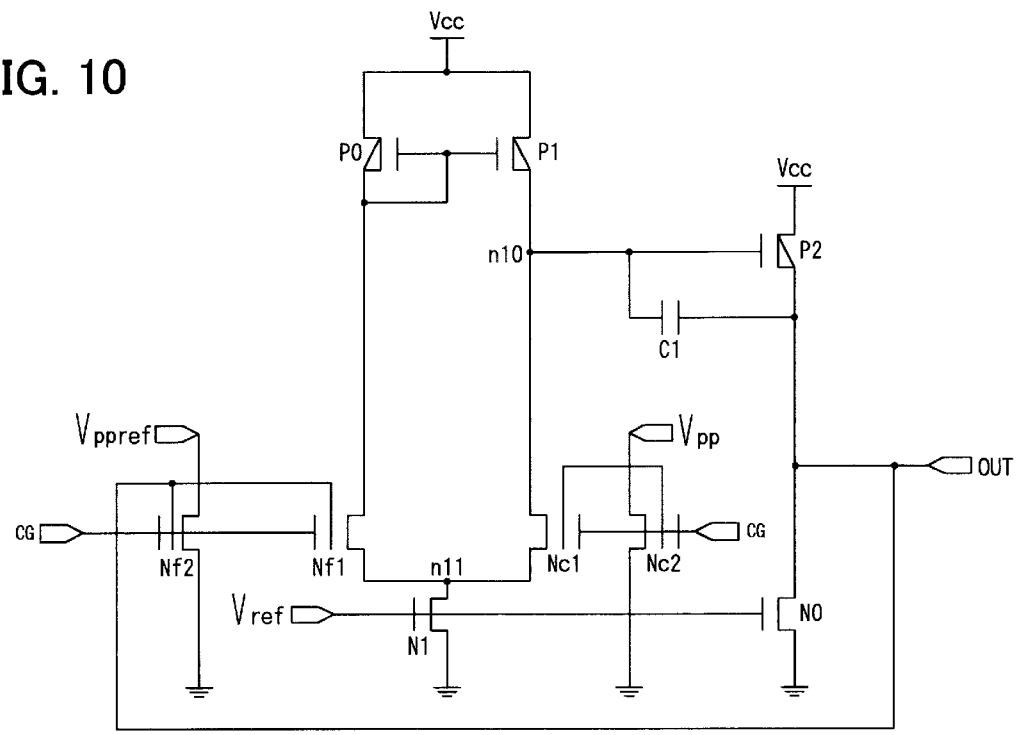
FIG. 10 shows an example in which the current source transistor of FIG. 2 is placed in FIG. 6.

FIG. 10 shows an example wherein the current source transistor of FIG. 2 is placed in FIG. 6. A current source transistor N1 is placed between the common source terminal n11 and the earth of the non-volatile memory circuit of FIG. 6. In addition, as in FIG. 9, the source terminal of the write transistor Nc2 is directly connected to the earth for programming operations.

Figure 11:
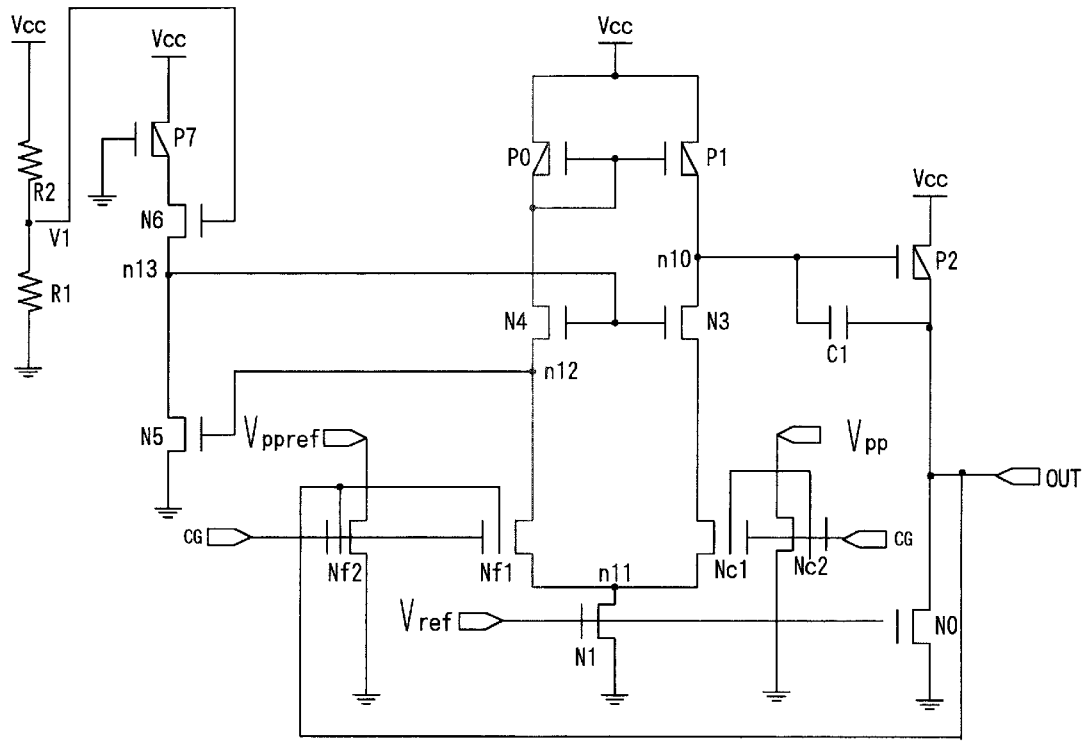
FIG. 11 shows a non-volatile memory circuit that combines all the characteristics of FIGS. 1, 2, 4, and 6.

FIG. 11 shows a non-volatile memory circuit that has all the characteristics of FIGS. 1, 2, 4, and 6. That is, in the memory circuit of FIG. 11, a constant current source transistor N1 is provided between the source terminal n11, which is common to storage transistor Nc and feedback transistor Nf, and the earth voltage. This broadens the dynamic range of the floating gate voltages that can be stored. Furthermore, a clamp circuit comprising transistors N3 and N4 is provided so that unnecessary writing does not take place in the storage transistor Nc.

Storage transistor Nc comprises a pair of transistors Nc1 and Nc2 and feedback transistor Nf comprises a pair of transistors Nf1 and Nf2. A charge can be injected into the floating gate while the floating gate voltage is being monitored. Moreover, the left and right circuit configurations of the comparator circuit are almost the same and are thus balanced, thereby allowing the floating gate voltage for the storage transistor Nc to be accurately generated in the output terminal OUT.

Figure 12:
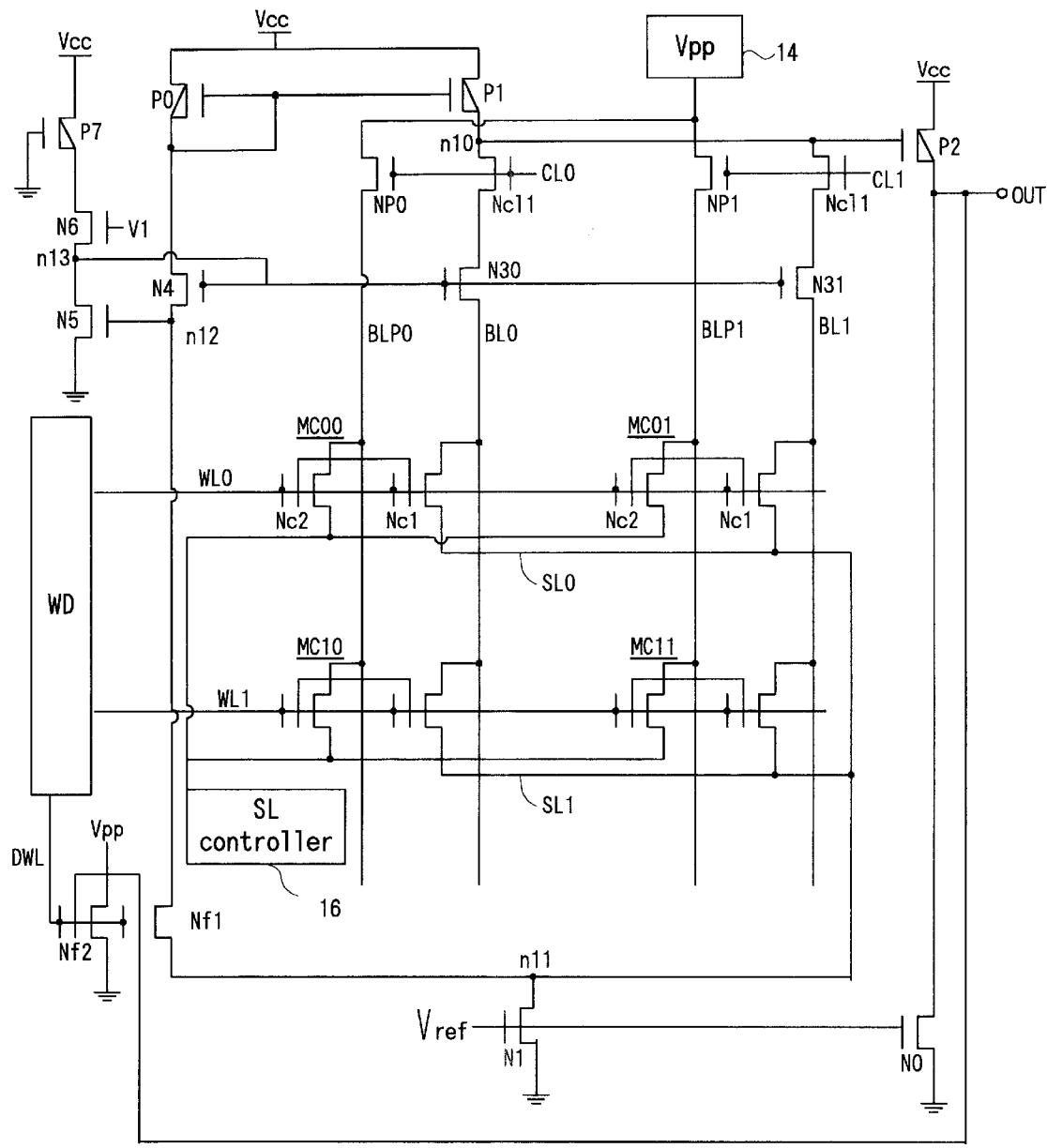
FIG. 12 is a circuit diagram of the non-volatile memory circuit of FIG. 11 wherein a 2×2 cell matrix is applied.

FIG. 12 is a circuit diagram wherein the non-volatile memory circuit of FIG. 11 is implemented in a 2×2 cell matrix. In FIG. 12, each of the paired storage transistors Nc1 and Nc2 shown in FIG. 11 are arranged in the total four memory cells MC00 through MC11 of the 2 rows by 2 columns array. Unlike in the circuit of FIG. 3, in the memory circuit of FIG. 12 each memory cell comprises a pair of transistors Nc1 and Nc2. Therefore, the bit line and source lines also come in a paired configuration. Unlike the example shown in FIG. 11, in the example in FIG. 12, the source line SL is controlled by the source voltage controller 16.

In memory cell MC00, the drain for read transistor Nc1 is connected to bit line BL0, the source is connected to source line SL0, and the control gate is connected to word line WL0. The drain for write transistor Nc2 is connected to another program bit line BLP0 and the source is connected to the source voltage controller 16. The control gate of the write transistor Nc1 is connected to word line WL0 and the floating gate is the same as the floating gate for the write transistor Nc1.

The other memory cells MC01 through MC11 have the same configuration. Bit lines BL0 and BL1, connected to the read transistor, are connected to transistor P1 of the current mirror circuit via column gates Nc10 and Nc11. Transistors N30 and N31 are also placed, as the clump circuit, between bit lines BL0 and BL1 and column gates Nc10 and Nc11.

Also, the program bit lines BLP0 and BLP1, which are connected to the write transistor NC2, are connected to program control circuit 14 via other column gates NP0 and NP1. This enables a program voltage Vpp to be applied to the drain of the write transistor Nc2 in the selected memory cell. The source terminal for the write transistor Nc2 is connected, as above, to the source voltage controller 16.

This enables an earth potential to be applied to the source of write transistor Nc2 in the selected memory cell when programming and the power source voltage Vcc to be applied when erasing.

As shown in FIG. 11, the feedback transistor Nf, used to detect the floating gate voltage of a memory cell transistor, comprises a pair of transistors Nf1 and Nf2. This pair of transistors has a common floating gate and is connected to the output terminal OUT. A dummy voltage Vppref is also applied to the drain of transistor Nf2. The dummy word line DWL is used to apply the same voltage as an ordinary word line WL to the control gates of feedback transistors Nf1 and Nf2.

According to the memory circuit shown in FIG. 12, while maintaining the charge injecting condition of applying the program voltage Vpp, ground, and power source voltage to the drain, source and control gate of the writing transistor Nc2 respectively in memory cells MC00 through MC11 according to the program control circuit 14, source line controller 16, and word driver WD, as FIG. 11, it is possible to directly detect, from the output terminal OUT, the voltage that matches the charges in the floating gate via the reading transistor Nc1.

In an erase operation, the control gate of the writing transistor Nc2 is controlled to a negative voltage (for example, −9V), the drain to a floating voltage, and the source to the power source voltage Vcc. The charge is extracted from the floating gate. In an erase verify operation, the control gate is again controlled to a prescribed voltage and the potential of the floating gate can be detected from the output terminal OUT.

EXAMPLE OF WRITE CIRCUIT IN NON-VOLATILE MEMORY CIRCUIT

Figure 13:
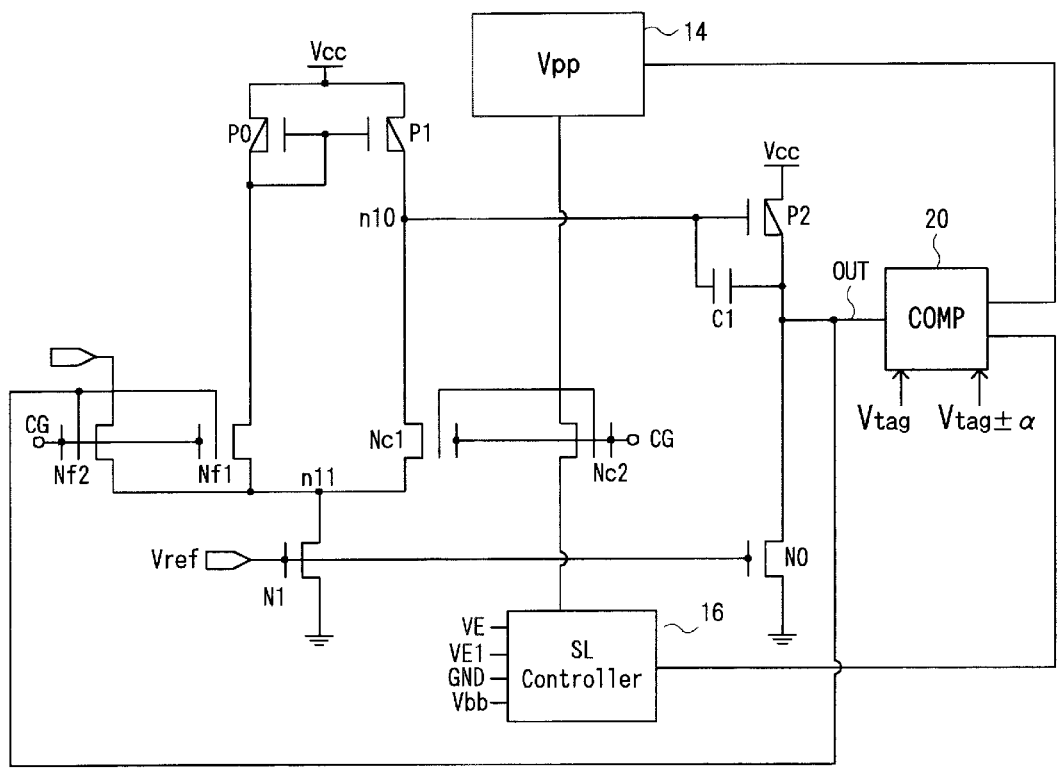
FIG. 13 explains the method to write information in a non-volatile memory circuit in the embodiment.

FIG. 13 explains the writing method used in a non-volatile memory circuit of the embodiment described above. For simplicity, the example of a memory circuit from FIG. 10 is used as the memory circuit in FIG. 13. In the circuit in FIG. 13, an output comparator circuit 20 is provided at the output terminal OUT for comparing the output terminal OUT with the floating gate voltage Vtag set as target or the voltage vtag +α immediately prior to the target voltage. This output comparator circuit 20 controls the program control circuit 14 and source line control circuit 16.

Use of the write circuit shown in FIG. 13 enables the charge in the floating gate of the storage transistor Nc to be more quickly and accurately made into the target value. The target voltage Vtag and the voltage immediately prior to it vtag +α are applied to the output comparator 20.

Figure 14:
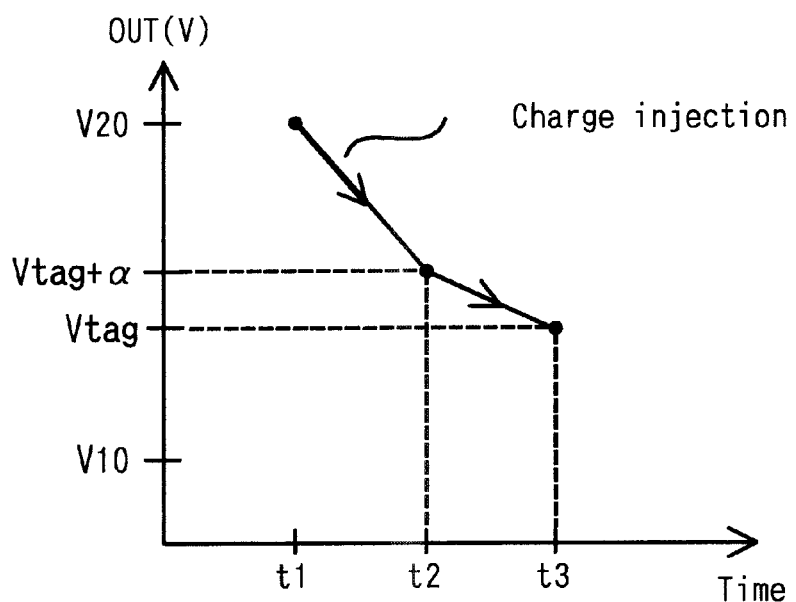
FIG. 14 is a graph that shows the method to write information using the circuit of FIG. 13.

FIG. 14 is a graph showing the writing method used in the circuit of FIG. 13. The horizontal axis represents time and the vertical axis represents the voltage of the output terminal OUT. When a charge is to be injected into the floating gate and its voltage is to drop, at time t1, the voltage in the control gate CG for the write transistor Nc2 is power source voltage Vcc, a voltage Vpp that is higher than the power source Vcc is supplied to the drain from the program control circuit 14, and the potential of the source terminal is set to earth potential GND by the source line controller 16. This means that injection of a charge into the floating gate starts and the voltage of the floating gate reduces.

At time t2, when the output terminal OUT voltage rises from the initial voltage V20 to Vtag +α, that is higher than the target voltage Vtag by a, the source voltage of write transistor Nc2 changes from earth potential GND to back bias potential Vbb (for example, +2V). This change is controlled by the output comparator 20. Such changes cause the speed with which the charge is injected into the floating gate of writing transistor Nc2 to drop. At time t3, when the output terminal OUT reaches the target voltage Vtag, application of program voltage Vpp by program control circuit 14 stops.

Conversely, in an erase operation, when a charge is to be extracted from the floating gate and the floating gate voltage is to be raised, a voltage that is different to that used in a read operation is applied to the control gate. Therefore, data cannot be erased while monitoring the potential of the floating gate as it can be done during programming. Accordingly, the erase operation is implemented with the control gate controlled to a negative voltage, the drain to a floating voltage, and the source voltage to a power source voltage. After the erase operation, the circuit is controlled to a read status and the potential of the floating gate is verified.

When the circuit in FIG. 13 is used, as shown in FIG. 14, while the voltage of the output terminal OUT is being monitored by the output comparator 20, the speed with which a charge is injected into the floating gate is dropped immediately prior to the target voltage Vtag. Thereafter, any injection of charge at the target voltage Vtag can be stopped accurately.

Figure 15A:
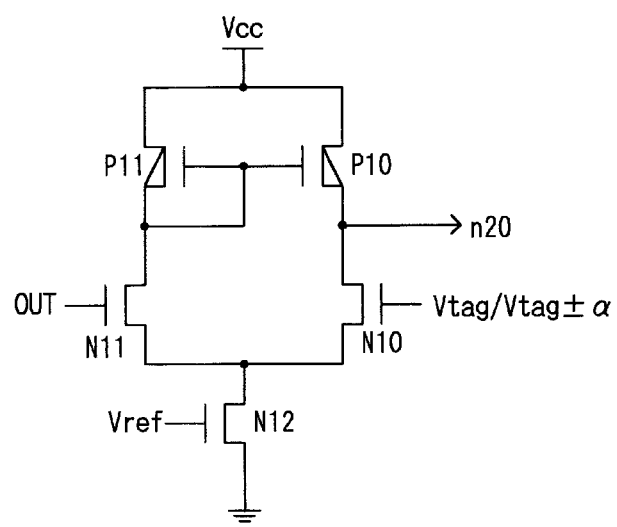
FIG. 15 consisting of FIG. 15A and 15B, shows an example of a circuit in an output comparator 20.

FIG. 15 shows an example of an output comparator 20 circuit. FIG. 15(A) is a comparator circuit of the differential amplifier type and comprises a pair of N channel transistors N10 and N11, both connected to a common source, current source transistor N12, and P channel transistors P10 and P11, that make up a current mirror circuit. The target voltage Vtag or voltage Vtag +α that is immediately prior to the target voltage is applied to the gate of transistor N10 and the voltage of the output terminal OUT is applied to the gate of transistor N11. This means that when the output terminal OUT is lower than the target voltage Vtag or the voltage immediately prior to the target voltage, that is vtag +α, the drain terminal n20 of the transistor N10 will be L level. When the output terminal OUT is higher, the drain terminal n20 will be H level. This signal n20 controls circuits 14 and 16 shown in FIG. 13.

Figure 15B:
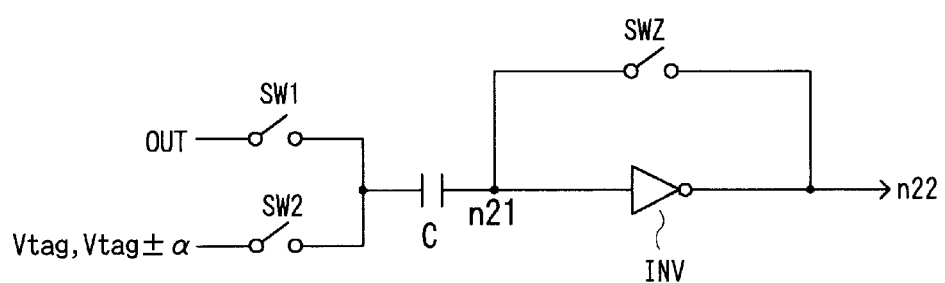

FIG. 15(B) is a chopper comparator circuit. A short-circuit switch SWZ is placed between the inverter INV input and output. By short-circuiting the switch SWZ, the initial potentials of the inverter INV input terminal n21 and output terminal n22 are set. One electrode of the capacitor C is connected to the input terminal n21 of the inverter INV and the target voltage Vtag or its immediately preceding voltage Vtag +α is applied, via switch SW2 to the other electrode of the capacitor C or, alternatively, to the output terminal OUT via switch SW1.

Firstly, switch SWZ is short-circuited, switch SW2 is short-circuited and target voltage Vtag (or its immediately preceding voltage Vtag +α) is applied to capacitor C. As a result of these initial settings, the inverter INV is balanced when the target voltage Vtag is applied to the capacitor C.

Next, switch SWZ is opened and SW1 short-circuited instead of switch SW2 to apply the potential of output terminal OUT to capacitor C. Here, when the voltage of output terminal OUT is lower than the target voltage Vtag (or its immediately preceding voltage Vtag +α), the voltage of the output n22 of the inverter INV will move to the H level. when the voltage of output terminal OUT is higher than the target voltage Vtag (or its immediately preceding voltage Vtag +α), the voltage of the output n22 of the inverter INV will move to the L level.

A number of other modification examples are also conceivable for the output comparator circuit.

It has been explained how, in the above embodiment, data can be easily read and written when multi-value information or analog information is to be recorded in the storage transistor. When recording binary information it is also possible to directly detect the voltage that matches the charge in the floating gate and so binary data can also be easily read or written.

The claims of the present invention are not limited by the above embodiment and extend to include the present invention as described in the claims and any equivalents.

INDUSTRIAL APPLICABILITY

According to the present invention as described above, the voltage that matches the charge accumulated in the floating gate of a storage transistor can be directly detected and multi-value and analog information can be easily written and read when it is to be recorded. The present invention can also be used for storing binary information and here too, reading and writing is simple.

What is claimed is:

1. A non-volatile memory circuit comprising:
   a storage transistor having a storage floating gate;
   a feedback transistor commonly connected at a source with said storage transistor and having a feedback floating gate;
   a load circuit connected to said storage transistor and feedback transistor;
   an output transistor, having a gate connected to the drain of said storage transistor, for generating a voltage corresponding to said gate voltage at an output terminal; and
   a feedback path provided between said output terminal and said feedback floating gate.

2. The non-volatile memory circuit according to claim 1, further comprising: a constant current circuit connected to said common source of said storage transistor and feedback transistor.

3. The non-volatile memory circuit according to either claim 1 or claim 2, further comprising a clamp transistor that is provided between said storage and feedback transistors and said load circuit, has a gate to which a reversed drain voltage of either of said storage and feedback transistors is returned, and clamps drain voltage of said storage and feedback transistors.

4. The non-volatile memory circuit according to either claim 1 or claim 2, wherein said storage transistor further comprises a write transistor that shares a control gate, said storage floating gate, and a source with the storage transistor, and to drain of which a prescribed control voltage is applied.

5. The non-volatile memory circuit according to claim 4, wherein said feedback transistor further comprises a dummy transistor that is substantially equivalent to said write transistor.

6. The non-volatile memory circuit according to either claim 1 or claim 2, further comprising a voltage control circuit which monitors potential of said output terminal while injecting a charge into said storage floating gate of said storage transistor, and mitigates said charge injection to said storage transistor when potential of said output terminal reaches a prescribed potential.

7. The non-volatile memory circuit according to claim 6, wherein said voltage control circuit lowers voltage between gate and source of said storage transistor when potential of said output terminal reaches said prescribed potential.

8. The non-volatile memory circuit according to claim 6, wherein said voltage control circuit changes source voltage for said storage transistor when potential of said output terminal reaches said prescribed potential.

* * * * *